(12) United States Patent
Chang et al.

(10) Patent No.: US 7,977,687 B2
(45) Date of Patent: Jul. 12, 2011

(54) LIGHT EMITTER DEVICE

(75) Inventors: Chun-Yen Chang, Hsinchu (TW); Tsung Hsi Yang, Shuilin Shiang (TW)

(73) Assignee: National Chiao Tung University, Hsinchu (TW)

( * ) Notice: Subject to any disclaimer, the term of this patent is extended or adjusted under 35 U.S.C. 154(b) by 291 days.

(21) Appl. No.: 12/291,396

(22) Filed: Nov. 7, 2008

(65) Prior Publication Data

US 2009/0278165 A1 Nov. 12, 2009

(30) Foreign Application Priority Data

May 9, 2008 (TW) ................................ 97117321 A

(51) Int. Cl.
*H01L 33/00* (2010.01)
(52) U.S. Cl. .............. 257/88; 257/79; 257/81; 257/103; 438/22; 438/48; 438/52
(58) Field of Classification Search .............. 257/79–99; 438/22, 48–55
See application file for complete search history.

(56) References Cited

U.S. PATENT DOCUMENTS

| | | | |
|---|---|---|---|
| 3,566,215 A | 2/1971 | Heywang | 317/235 |
| 3,593,191 A | 7/1971 | Henker | 331/94.5 |
| 3,655,439 A | 4/1972 | Seiter | 117/212 |
| 3,658,585 A | 4/1972 | Folkmann et al. | 117/201 |
| 3,704,427 A | 11/1972 | Heywang | 331/94.5 |
| 3,705,567 A | 12/1972 | Emels | 118/49 |
| 3,737,737 A | 6/1973 | Heywang et al. | 317/234 R |
| 3,747,559 A | 7/1973 | Dietze | 118/48 |
| 3,793,984 A | 2/1974 | Kasper et al. | 118/48 |
| 3,819,974 A | 6/1974 | Stevenson et al. | 313/499 |
| 3,853,974 A | 12/1974 | Reuschel et al. | 264/81 |
| 3,941,647 A | 3/1976 | Druminski | 156/612 |
| 3,948,693 A | 4/1976 | Weyrich et al. | 148/171 |
| 3,963,537 A | 6/1976 | Kniepkamp et al. | 148/175 |
| 3,965,347 A | 6/1976 | Heywang | 250/211 J |
| 3,974,561 A | 8/1976 | Schnoeller | 29/611 |
| 4,020,791 A | 5/1977 | Reuschel et al. | 118/49.1 |
| 4,062,035 A | 12/1977 | Winstel | 357/17 |
| 4,098,223 A | 7/1978 | Ertl et al. | 118/48 |
| 4,102,298 A | 7/1978 | Dietze et al. | 118/5 |
| 4,108,539 A | 8/1978 | Gort et al. | 350/201 |
| 4,113,381 A | 9/1978 | Epstein | 356/5 |
| 4,133,702 A | 1/1979 | Krimmel | 148/1.5 |

(Continued)

FOREIGN PATENT DOCUMENTS

CA 1325582 12/1993

(Continued)

OTHER PUBLICATIONS

"Novel Metalorganic Chemical Vapor Deposition System for GaN Growth," S. Nakamura, American Institue of Physics, pp. 2021-2023, May 6, 1991.

(Continued)

*Primary Examiner* — Dung A. Le
(74) *Attorney, Agent, or Firm* — Haverstock & Owens LLP

(57) ABSTRACT

A light emitting device (LED) structure formed on a Group IV-based semiconductor substrate is provided. The LED structure includes a Group IV-based substrate, an AlN nucleation layer formed on the Group IV-based substrate, a GaN epitaxial layer formed on the AlN nucleation layer, a distributed Bragg reflector (DBR) multi-layer structure formed on the epitaxial layer, and an LED active layer formed on the DBR multi-layer structure.

16 Claims, 5 Drawing Sheets

U.S. PATENT DOCUMENTS

| | | | | |
|---|---|---|---|---|
| 4,140,546 | A | 2/1979 | Krimmel | 148/1.5 |
| 4,154,625 | A | 5/1979 | Golovchenko et al. | 148/15 |
| 4,170,018 | A | 10/1979 | Runge | 357/17 |
| 4,261,770 | A | 4/1981 | Splittgerber et al. | 148/171 |
| 4,351,695 | A | 9/1982 | Hieber et al. | 156/603 |
| 4,404,265 | A | 9/1983 | Manasevit | 428/689 |
| 4,410,993 | A | 10/1983 | Zschauer | 372/44 |
| 4,423,349 | A | 12/1983 | Nakajima et al. | 313/487 |
| 4,505,765 | A | 3/1985 | Trommer | 148/171 |
| 4,521,448 | A | 6/1985 | Sasaki | 427/88 |
| 4,531,142 | A | 7/1985 | Weyrich et al. | 357/17 |
| 4,568,206 | A | 2/1986 | Imazaike | 384/530 |
| 4,596,998 | A | 6/1986 | Krimmel | 357/17 |
| 4,599,244 | A | 7/1986 | Falckenberg et al. | 427/74 |
| 4,599,245 | A | 7/1986 | Falckenberg et al. | 427/74 |
| 4,604,637 | A | 8/1986 | Ruhle et al. | 357/17 |
| 4,615,766 | A | 10/1986 | Jackson et al. | 156/662 |
| 4,656,636 | A | 4/1987 | Amann et al. | 372/50 |
| 4,661,175 | A | 4/1987 | Kuphal et al. | 148/171 |
| 4,670,093 | A | 6/1987 | Maerz et al. | 156/649 |
| 4,682,337 | A | 7/1987 | Amann | 372/44 |
| 4,683,574 | A | 7/1987 | Heinen | 372/44 |
| 4,722,088 | A | 1/1988 | Wolf | 372/44 |
| 4,740,259 | A | 4/1988 | Heinen | 156/234 |
| 4,742,525 | A | 5/1988 | Heinen et al. | 372/44 |
| 4,744,088 | A | 5/1988 | Heinen et al. | 372/50 |
| 4,746,195 | A | 5/1988 | Auracher et al. | 350/320 |
| 4,763,979 | A | 8/1988 | Heywang | 350/96.2 |
| 4,768,199 | A | 8/1988 | Heinen et al. | 372/36 |
| 4,792,200 | A | 12/1988 | Amann et al. | 350/96.12 |
| 4,792,959 | A | 12/1988 | Mueller et al. | 372/46 |
| 4,818,722 | A | 4/1989 | Heinen | 437/129 |
| 4,829,188 | A | 5/1989 | Shinomiya et al. | 250/483.1 |
| 4,835,575 | A | 5/1989 | Plihal | 357/30 |
| 4,841,344 | A | 6/1989 | Heinen | 357/17 |
| 4,845,723 | A | 7/1989 | Heinen et al. | 372/38 |
| 4,855,118 | A | 8/1989 | Ichinose et al. | 423/301 |
| 4,859,903 | A | 8/1989 | Minematu et al. | 313/487 |
| 4,864,369 | A | 9/1989 | Snyder et al. | 357/17 |
| 4,869,568 | A | 9/1989 | Schimpe | 350/96.12 |
| 4,890,033 | A | 12/1989 | Ichinomiya et al. | 313/487 |
| 4,904,617 | A | 2/1990 | Muschke | 437/129 |
| 4,904,618 | A | 2/1990 | Neumark | 437/150 |
| 4,907,044 | A | 3/1990 | Schellhorn et al. | 357/17 |
| 4,907,534 | A | 3/1990 | Huang et al. | 118/725 |
| 4,911,102 | A | 3/1990 | Manabe et al. | 118/719 |
| 4,918,497 | A | 4/1990 | Edmond | 357/17 |
| 4,929,907 | A | 5/1990 | Berkel | 330/252 |
| 4,944,837 | A | 7/1990 | Nishikawa et al. | 156/646 |
| 4,945,394 | A | 7/1990 | Palmour et al. | 357/34 |
| 4,946,547 | A | 8/1990 | Palmour et al. | 156/643 |
| 4,947,218 | A | 8/1990 | Edmond et al. | 357/13 |
| 4,959,174 | A | 9/1990 | Nakajima et al. | 252/301.6 R |
| 4,960,728 | A | 10/1990 | Schaake et al. | 437/82 |
| 4,966,862 | A | 10/1990 | Edmond | 437/100 |
| 4,971,739 | A | 11/1990 | Ichinose et al. | 264/61 |
| 4,977,567 | A | 12/1990 | Hanke | 372/45 |
| 4,982,314 | A | 1/1991 | Miki | 363/16 |
| 4,985,742 | A | 1/1991 | Pankove | 357/34 |
| 4,987,576 | A | 1/1991 | Heinen | 372/46 |
| 4,990,466 | A | 2/1991 | Shieh et al. | 437/129 |
| 4,990,990 | A | 2/1991 | Albrecht et al. | 357/30 |
| 5,005,057 | A | 4/1991 | Izumiya et al. | 357/17 |
| 5,006,908 | A | 4/1991 | Matsuoka et al. | 357/17 |
| 5,008,735 | A | 4/1991 | Edmond et al. | 357/74 |
| 5,008,789 | A | 4/1991 | Arai et al. | 362/255 |
| 5,019,746 | A | 5/1991 | Merg | 313/512 |
| 5,023,686 | A | 6/1991 | Helmut et al. | 357/30 |
| 5,027,168 | A | 6/1991 | Edmond | 357/17 |
| 5,034,956 | A | 7/1991 | Gessner et al. | 372/45 |
| 5,041,334 | A | 8/1991 | Nakajima et al. | 428/407 |
| 5,042,043 | A | 8/1991 | Hatano et al. | 372/45 |
| 5,045,896 | A | 9/1991 | Ash et al. | 357/17 |
| 5,049,779 | A | 9/1991 | Itsuki et al. | 313/486 |
| 5,061,972 | A | 10/1991 | Edmond | 357/13 |
| 5,065,207 | A | 11/1991 | Heinen | 357/30 |
| 5,077,145 | A | 12/1991 | Shinomiya et al. | 428/691 |
| 5,093,576 | A | 3/1992 | Edmond et al. | 250/370.01 |
| 5,119,540 | A | 6/1992 | Kong et al. | 29/25.01 |
| 5,120,619 | A | 6/1992 | Nakajima et al. | 428/690 |
| 5,122,845 | A | 6/1992 | Manabe et al. | 357/17 |
| 5,128,955 | A | 7/1992 | Danielmeyer | 372/94 |
| 5,146,465 | A | 9/1992 | Khan et al. | 372/45 |
| 5,155,062 | A | 10/1992 | Coleman | 437/100 |
| 5,171,370 | A | 12/1992 | Reithmaier et al. | 118/726 |
| 5,182,670 | A | 1/1993 | Khan et al. | 359/359 |
| 5,184,247 | A | 2/1993 | Schimpe | 359/344 |
| 5,185,207 | A | 2/1993 | Furuoka et al. | 428/404 |
| 5,200,022 | A | 4/1993 | Kong et al. | 156/612 |
| 5,202,777 | A | 4/1993 | Sluzky et al. | 359/50 |
| 5,205,905 | A | 4/1993 | Kotaki et al. | 156/662 |
| 5,208,878 | A | 5/1993 | Thulke | 385/14 |
| 5,210,051 | A | 5/1993 | Carter, Jr. | 437/107 |
| 5,218,216 | A | 6/1993 | Manabe et al. | 257/103 |
| 5,229,626 | A | 7/1993 | Ebitani et al. | 257/84 |
| 5,233,204 | A | 8/1993 | Fletcher et al. | 257/13 |
| 5,239,188 | A | 8/1993 | Takeuchi et al. | 257/76 |
| 5,247,533 | A | 9/1993 | Okazaki et al. | 372/45 |
| 5,250,366 | A | 10/1993 | Nakajima et al. | 428/690 |
| 5,252,499 | A | 10/1993 | Rothschild | 437/22 |
| 5,252,839 | A | 10/1993 | Fouquet | 257/13 |
| 5,260,960 | A | 11/1993 | Amann et al. | 372/46 |
| 5,264,713 | A | 11/1993 | Palmour | 257/77 |
| 5,266,503 | A | 11/1993 | Wang et al. | 437/24 |
| 5,270,554 | A | 12/1993 | Palmour | 257/77 |
| 5,272,108 | A | 12/1993 | Kozawa | 437/127 |
| 5,278,433 | A | 1/1994 | Manabe et al. | 257/103 |
| 5,281,830 | A | 1/1994 | Kotaki et al. | 257/86 |
| 5,290,393 | A | 3/1994 | Nakamura | 156/613 |
| 5,306,662 | A | 4/1994 | Nakamura et al. | 437/107 |
| 5,312,560 | A | 5/1994 | Somatomo et al. | 252/301.4 S |
| 5,323,022 | A | 6/1994 | Glass et al. | 257/77 |
| 5,330,791 | A | 7/1994 | Aihara et al. | 427/215 |
| 5,334,277 | A | 8/1994 | Nakamura | 117/102 |
| 5,336,080 | A | 8/1994 | Sumitomo et al. | 428/407 |
| 5,338,944 | A | 8/1994 | Edmond et al. | 257/76 |
| 5,341,390 | A | 8/1994 | Yamada et al. | 372/45 |
| 5,343,316 | A | 8/1994 | Morimoto et al. | 359/50 |
| 5,344,791 | A | 9/1994 | Huang | 437/126 |
| 5,359,345 | A | 10/1994 | Hunter | 345/102 |
| 5,363,390 | A | 11/1994 | Yang et al. | 372/22 |
| 5,366,834 | A | 11/1994 | Yoneda et al. | 430/23 |
| 5,369,289 | A | 11/1994 | Tamaki et al. | 257/99 |
| 5,376,303 | A | 12/1994 | Royce et al. | 252/301.4 R |
| 5,376,580 | A | 12/1994 | Kish et al. | 437/127 |
| 5,381,103 | A | 1/1995 | Edmond et al. | 324/753 |
| 5,382,822 | A | 1/1995 | Stein | 257/410 |
| 5,389,571 | A | 2/1995 | Takeuchi et al. | 437/133 |
| 5,390,210 | A | 2/1995 | Fouquet et al. | 372/92 |
| 5,393,993 | A | 2/1995 | Edmond et al. | 257/77 |
| 5,394,005 | A | 2/1995 | Brown et al. | 257/461 |
| 5,403,774 | A | 4/1995 | Shieh et al. | 437/129 |
| 5,404,282 | A | 4/1995 | Klinke et al. | 362/249 |
| 5,408,120 | A | 4/1995 | Manabe et al. | 257/431 |
| 5,409,859 | A | 4/1995 | Glass et al. | 437/187 |
| 5,416,342 | A | 5/1995 | Edmond et al. | 257/76 |
| 5,417,886 | A | 5/1995 | Tateiwa et al. | 252/301.4 R |
| 5,433,169 | A | 7/1995 | Nakamura | 117/102 |
| 5,433,533 | A | 7/1995 | Imazaike | 384/488 |
| 5,433,888 | A | 7/1995 | Okada et al. | 252/301.4 R |
| 5,435,938 | A | 7/1995 | Bando et al. | 252/301.4 S |
| 5,438,198 | A | 8/1995 | Ebitani et al. | 250/330 |
| 5,459,107 | A | 10/1995 | Palmour | 437/238 |
| 5,465,249 | A | 11/1995 | Cooper, Jr. et al. | 365/149 |
| 5,467,291 | A | 11/1995 | Fan et al. | 364/578 |
| 5,468,678 | A | 11/1995 | Nakamura et al. | 437/107 |
| 5,475,241 | A | 12/1995 | Harrah et al. | 257/99 |
| 5,497,012 | A | 3/1996 | Moll | 257/183 |
| 5,502,316 | A | 3/1996 | Kish et al. | 257/94 |
| 5,506,421 | A | 4/1996 | Palmour | 257/77 |
| 5,511,084 | A | 4/1996 | Amann | 372/20 |
| 5,514,627 | A | 5/1996 | Lowery et al. | 437/209 |
| 5,523,018 | A | 6/1996 | Okada et al. | 252/301.4 P |
| 5,523,589 | A | 6/1996 | Edmond et al. | 257/77 |
| 5,539,217 | A | 7/1996 | Edmond et al. | 257/77 |
| 5,563,422 | A | 10/1996 | Nakamura et al. | 257/13 |
| 5,578,839 | A | 11/1996 | Nakamura et al. | 257/96 |

| | | | |
|---|---|---|---|
| 5,583,879 A | 12/1996 | Yamazaki et al. | 372/45 |
| 5,585,648 A | 12/1996 | Tischler | 257/77 |
| 5,587,593 A | 12/1996 | Koide et al. | 257/94 |
| 5,592,501 A | 1/1997 | Edmond et al. | 372/45 |
| 5,592,578 A | 1/1997 | Ruh | 385/31 |
| 5,596,595 A | 1/1997 | Tan et al. | 372/96 |
| 5,604,135 A | 2/1997 | Edmond et al. | 437/22 |
| 5,604,763 A | 2/1997 | Kato et al. | 372/45 |
| 5,612,260 A | 3/1997 | Palmour | 437/238 |
| 5,614,736 A | 3/1997 | Neumann et al. | 257/102 |
| 5,616,177 A | 4/1997 | Yamada | 117/102 |
| 5,620,557 A | 4/1997 | Manabe et al. | 438/507 |
| 5,621,749 A | 4/1997 | Baney | 372/69 |
| 5,625,202 A | 4/1997 | Chai | 257/94 |
| 5,627,244 A | 5/1997 | Sato | 526/92 |
| 5,629,531 A | 5/1997 | Palmour | 257/77 |
| 5,631,190 A | 5/1997 | Negley | 438/33 |
| 5,635,146 A | 6/1997 | Singh et al. | 423/65 |
| 5,642,375 A | 6/1997 | King et al. | 372/97 |
| 5,650,641 A | 7/1997 | Sassa et al. | 257/88 |
| 5,652,434 A | 7/1997 | Nakamura et al. | 257/13 |
| 5,652,438 A | 7/1997 | Sassa et al. | 257/94 |
| 5,656,832 A | 8/1997 | Ohba et al. | 257/190 |
| 5,659,568 A | 8/1997 | Wang et al. | 372/96 |
| 5,661,074 A | 8/1997 | Tischler | 438/32 |
| 5,661,316 A | 8/1997 | Kish, Jr. et al. | 257/190 |
| 5,661,742 A | 8/1997 | Huang et al. | 372/46 |
| 5,670,798 A | 9/1997 | Schetzina | 257/96 |
| 5,679,153 A | 10/1997 | Dmitriev et al. | 117/106 |
| 5,684,623 A | 11/1997 | King et al. | 359/346 |
| 5,686,737 A | 11/1997 | Allen | 257/77 |
| 5,700,713 A | 12/1997 | Yamazaki et al. | 437/129 |
| 5,707,139 A | 1/1998 | Haitz | 362/231 |
| 5,718,760 A | 2/1998 | Carter et al. | 117/84 |
| 5,719,409 A | 2/1998 | Singh et al. | 257/77 |
| 5,724,062 A | 3/1998 | Hunter | 345/102 |
| 5,724,373 A | 3/1998 | Chang | 372/20 |
| 5,724,376 A | 3/1998 | Kish, Jr. et al. | 372/96 |
| 5,727,014 A | 3/1998 | Wang et al. | 372/96 |
| 5,729,029 A | 3/1998 | Rudaz | 257/13 |
| 5,729,567 A | 3/1998 | Nakagawa | 372/99 |
| 5,733,796 A | 3/1998 | Manabe et al. | 437/127 |
| 5,734,182 A | 3/1998 | Nakamura et al. | 257/96 |
| 5,739,552 A | 4/1998 | Kimura et al. | 257/89 |
| 5,739,554 A | 4/1998 | Edmond et al. | 257/103 |
| 5,741,431 A | 4/1998 | Shih | 216/65 |
| 5,741,724 A | 4/1998 | Ramdani et al. | 437/128 |
| 5,742,133 A | 4/1998 | Wilhelm et al. | 315/291 |
| 5,747,832 A | 5/1998 | Nakamura et al. | 257/103 |
| 5,753,939 A | 5/1998 | Sassa et al. | 257/94 |
| 5,758,951 A | 6/1998 | Haitz | 362/259 |
| 5,761,229 A | 6/1998 | Baldwin et al. | 372/31 |
| 5,767,581 A | 6/1998 | Nakamura et al. | 257/749 |
| 5,771,254 A | 6/1998 | Baldwin et al. | 372/31 |
| 5,776,837 A | 7/1998 | Palmour | 438/767 |
| 5,777,350 A | 7/1998 | Nakamura et al. | 257/96 |
| 5,777,433 A | 7/1998 | Lester et al. | 313/512 |
| 5,779,924 A | 7/1998 | Krames et al. | 216/24 |
| 5,780,120 A | 7/1998 | Belouet et al. | 427/554 |
| 5,785,404 A | 7/1998 | Wiese | 362/32 |
| 5,786,606 A | 7/1998 | Nishio et al. | 257/103 |
| 5,793,054 A | 8/1998 | Nido | 257/18 |
| 5,793,062 A | 8/1998 | Kish, Jr. et al. | 257/98 |
| 5,805,624 A | 9/1998 | Yang et al. | 372/45 |
| 5,808,323 A | 9/1998 | Spaeth et al. | 257/88 |
| 5,808,592 A | 9/1998 | Mizutani et al. | 345/83 |
| 5,809,050 A | 9/1998 | Baldwin et al. | 372/31 |
| 5,811,319 A | 9/1998 | Koike et al. | 438/46 |
| 5,811,931 A | 9/1998 | Mueller-Mach et al. | 313/512 |
| 5,812,105 A | 9/1998 | Van De Ven | 345/83 |
| 5,812,570 A | 9/1998 | Spaeth | 372/36 |
| 5,814,870 A | 9/1998 | Spaeth | 257/433 |
| 5,818,861 A | 10/1998 | Tan et al. | 372/46 |
| 5,828,684 A | 10/1998 | Van De Walle | 372/45 |
| 5,831,288 A | 11/1998 | Singh et al. | 257/77 |
| 5,835,514 A | 11/1998 | Yuen et al. | 372/36 |
| 5,835,522 A | 11/1998 | King et al. | 372/97 |
| 5,837,561 A | 11/1998 | Kish, Jr. et al. | 438/47 |
| 5,838,706 A | 11/1998 | Edmond et al. | 372/45 |
| 5,838,707 A | 11/1998 | Ramdani et al. | 372/45 |
| 5,838,708 A | 11/1998 | Lin et al. | 372/50 |
| 5,846,844 A | 12/1998 | Akasaki et al. | 437/21 |
| 5,847,507 A | 12/1998 | Butterworth et al. | 313/512 |
| 5,850,410 A | 12/1998 | Kuramata | 372/43 |
| 5,855,924 A | 1/1999 | Lumbard | 425/116 |
| 5,858,277 A | 1/1999 | Chau et al. | 252/301.4 F |
| 5,859,496 A | 1/1999 | Murazaki et al. | 313/485 |
| 5,861,190 A | 1/1999 | Greene et al. | 427/248.1 |
| 5,861,713 A | 1/1999 | Kondo et al. | 313/495 |
| 5,862,167 A | 1/1999 | Sassa et al. | 372/45 |
| 5,867,516 A | 2/1999 | Corzine et al. | 372/45 |
| 5,868,837 A | 2/1999 | Disalvo et al. | 117/952 |
| 5,877,558 A | 3/1999 | Nakamura et al. | 257/749 |
| 5,879,587 A | 3/1999 | Yale | 252/301.45 |
| 5,879,588 A | 3/1999 | Yale | 252/301.45 |
| 5,880,486 A | 3/1999 | Nakamura et al. | 257/96 |
| 5,889,802 A | 3/1999 | Walker | 372/31 |
| 5,889,806 A | 3/1999 | Nagai et al. | 372/45 |
| 5,892,784 A | 4/1999 | Tan et al. | 372/43 |
| 5,892,787 A | 4/1999 | Tan et al. | 372/96 |
| 5,900,650 A | 5/1999 | Nitta | 257/94 |
| 5,905,276 A | 5/1999 | Manabe et al. | 257/103 |
| 5,907,151 A | 5/1999 | Gramann et al. | 250/214.1 |
| 5,912,477 A | 6/1999 | Negley | 257/95 |
| 5,917,202 A | 6/1999 | Haitz et al. | 257/98 |
| 5,919,422 A | 7/1999 | Yamanaka et al. | 422/121 |
| 5,920,766 A | 7/1999 | Floyd | 438/35 |
| 5,923,053 A | 7/1999 | Jakowetz et al. | 257/95 |
| 5,923,118 A | 7/1999 | Jennato et al. | 313/485 |
| 5,923,690 A | 7/1999 | Kume et al. | 372/46 |
| 5,923,946 A | 7/1999 | Negley | 438/4 |
| 5,925,898 A | 7/1999 | Spath | 257/98 |
| 5,927,995 A | 7/1999 | Chen et al. | 438/517 |
| 5,935,705 A | 8/1999 | Chen et al. | 428/367 |
| 5,936,985 A | 8/1999 | Yamamoto et al. | 372/38 |
| 5,945,689 A | 8/1999 | Koike et al. | 257/88 |
| 5,953,361 A | 9/1999 | Borchert et al. | 372/96 |
| 5,953,581 A | 9/1999 | Yamasaki et al. | 438/22 |
| 5,958,295 A | 9/1999 | Yale | 252/301.4 S |
| 5,959,316 A | 9/1999 | Lowery | 257/98 |
| 5,959,401 A | 9/1999 | Asami et al. | 313/503 |
| 5,964,943 A | 10/1999 | Stein et al. | 117/88 |
| 5,966,393 A | 10/1999 | Hide et al. | 372/23 |
| 5,968,265 A | 10/1999 | Stein et al. | 117/71 |
| 5,969,378 A | 10/1999 | Singh | 257/77 |
| 5,972,781 A | 10/1999 | Wegleiter et al. | 438/460 |
| 5,972,801 A | 10/1999 | Lipkin et al. | 438/770 |
| 5,973,336 A | 10/1999 | Hanke et al. | 257/94 |
| 5,980,631 A | 11/1999 | Tews et al. | 117/89 |
| 5,981,945 A | 11/1999 | Spaeth et al. | 250/239 |
| 5,981,979 A | 11/1999 | Brunner | 257/99 |
| 5,982,970 A | 11/1999 | Schneider | 385/125 |
| 5,986,317 A | 11/1999 | Wiese | 257/433 |
| 5,991,160 A | 11/1999 | Lumbard | 361/760 |
| 5,994,722 A | 11/1999 | Averbeck et al. | 257/89 |
| 5,998,925 A | 12/1999 | Shimizu et al. | 313/503 |
| 5,999,552 A | 12/1999 | Bogner et al. | 372/43 |
| 6,306,672 B1 * | 10/2001 | Kim | 438/22 |
| 6,943,377 B2 * | 9/2005 | Gaska et al. | 257/79 |
| 2005/0040413 A1 * | 2/2005 | Takahashi et al. | 257/96 |
| 2005/0067625 A1 * | 3/2005 | Hata | 257/81 |

FOREIGN PATENT DOCUMENTS

| | | |
|---|---|---|
| DE | 19648955 A1 | 5/1997 |
| EP | 0356059 A2 | 2/1990 |
| EP | 0356059 A3 | 2/1990 |
| EP | 0380340 A2 | 8/1990 |
| EP | 0380340 A3 | 8/1990 |
| EP | 0637069 A1 | 2/1995 |
| EP | 0731512 A2 | 9/1996 |
| EP | 0731512 A3 | 7/1997 |
| EP | 0781619 A1 | 7/1997 |
| EP | 0871208 A2 | 10/1998 |
| EP | 0880181 A2 | 11/1998 |
| EP | 0871208 A3 | 12/1998 |
| EP | 0880181 A3 | 1/1999 |
| EP | 0905799 A2 | 3/1999 |
| EP | 0936682 A1 | 8/1999 |

| | | |
|---|---|---|
| FR | 2613136 | 9/1988 |
| GB | 2322737 A | 3/1998 |
| GB | 2323210 A | 9/1998 |
| JP | 04144294 | 5/1992 |
| JP | 05152609 | 6/1993 |
| JP | 0766192 | 3/1995 |
| JP | 7176794 | 7/1995 |
| JP | 1064854 | 7/1996 |
| JP | 10233529 | 2/1997 |
| JP | 09180998 | 7/1997 |
| JP | 09193137 | 7/1997 |
| JP | 09246651 | 9/1997 |
| JP | 09260772 | 10/1997 |
| JP | 09293935 | 11/1997 |
| JP | 10242565 | 9/1998 |
| JP | 10256645 | 9/1998 |
| JP | 10270792 | 10/1998 |
| JP | 10290027 | 10/1998 |
| JP | 10294529 | 11/1998 |
| JP | 10321962 | 12/1998 |
| JP | 1104893 | 2/1999 |
| JP | 2000-31599 | 1/2000 |
| WO | WO9702478 A1 | 1/1997 |
| WO | WO9702610 A1 | 1/1997 |
| WO | WO9717730 A1 | 5/1997 |
| WO | WO9727629 A1 | 7/1997 |
| WO | WO9739485 A1 | 10/1997 |
| WO | WO9750132 A1 | 12/1997 |
| WO | WO9805078 A1 | 2/1998 |
| WO | WO9812757 A1 | 3/1998 |
| WO | WO9834304 A1 | 8/1998 |
| WO | WO9837586 A1 | 8/1998 |
| WO | WO9842879 A1 | 10/1998 |
| WO | WO9842897 A1 | 10/1998 |
| WO | WO9847185 A1 | 10/1998 |
| WO | WO9849731 A1 | 11/1998 |
| WO | WO9857378 A1 | 12/1998 |
| WO | WO9910936 A2 | 3/1999 |
| WO | WO9910936 A3 | 3/1999 |
| WO | WO9918617 A1 | 4/1999 |

OTHER PUBLICATIONS

"Out of the Blue," Forbes Global Magazine, pp. 66-71, Sep. 6, 1999.
"Nitride PN Junctions Grown on SiC Substrates," V.A. Dmitriev, Inst. Phys. Conf., pp. 1019-1022, Jan. 1996.
"AlGaN PN Junctions," V.A. Dmitriev, American Inst. of Physics, pp. 115-117, May 11, 1995.
"Effect of Ar Ion Laser Irradiation on MOVPE of ZnSe using DMZn and DMSe as Reactants," A. Yoshikawa, Journal of Crystal Growth, pp. 653-658, Jan. 1991.
"Electric Breakdown in GaN P-N Junctions," V.A. Dmitriev, American Inst. of Physics, pp. 229-231, Jan. 8, 1996.
"High Quanlity GaN Grown Directly on SiC by Halide Vapour Phase Epitaxy," Y.V. Melnik, Inst. Phys. Conf., pp. 863-866, Jan. 1996.
"Luminescence Conversion of Blue Light Emitting Diodes," P. Schlotter, Journal of Applied Physics, pp. 12-13, Feb. 27, 1997.
"P-Type Conduction in Mg-Doped GaN Treated with Low-Energy Electron Beam Irradiation (LEEBI)," H. Amano, Japanese Journal of Applied Physics, pp. 2112-2114, Dec. 1989.
"Photoluminescence of Mg-Doped P-Type GaN and Electroluminescence of GaN P-N Junction Led," I. Akasaki, Journal of Luminescence vol. 48-49, pp. 666-670, Jan. 1991.
"Recent Progress in AlGaN/GaN Laser Structures on 6H-SiC," G.E. Bulman, SPIE vol. 2693, pp. 57-63, Jan. 1996.
"Recent Progress in GaN/SiC LEDs and Photopumped Lasers," G.E. Bulman, pp. 100-101, Jan. 1995.
"Role of Growth Initiation for High-Brightness GaN-Based Light Emitting Diodes," R.S. Kern, 2nd. Intern. Symp. on Blue Laser and Light Emitting Diodes, Chiba, Japan, pp. 433-436, Sep. 29, 1998-Oct. 2, 1998.
"The State of SiC: GaN-Based Blue LEDs," J. Edmond, Inst. Phys. Conf. Ser. No. 142, Chap. 6, pp. 991-664, Jan. 1996.
"Wide Bandgap Group-III Nitride Optoelectronics," http://www.phy.duke.edu/research/photon/terahertz/gan/index.html pp. 1-3, Jan. 31, 1999.
"White LED Production at Osram," G. Bogner, Compound Semiconductor, pp. 28, 30-31, May 1999.
"InGaN/GaN/AlGaN-based laser diodes with modulation-doped strained-layer superlattices grown on epitaxially laterally overgrown GaN substrate," Shuji Nakamura et al., Applied Physics Letter, vol. 72, No. 2, Jan. 12, 1998.
"InGaN Multiple-Quantum-Well Light Emitting Diodes on Si(111)Substrates," B.J. Zhang et al., Phys. Stat. Sol. (a) 188, No. 1, 151-154, Aug. 4, 2001.
"Crack-Free InGaN/GaN Light emitters on Si(111)," A Dadgar et al., Phys. Stat. Sol. (a) 188, No. 1, 155-158, Aug. 1, 2001.
"Growth of InGaN/GaN multiple-quantum-well blue light-emitting diodes on silicon by matalorganic vapor phase epitaxy," Chuong A Tran et al., Applied Physics Letters, vol. 75, No. 11, Sep. 13, 1999.
US 5,961,723, 10/1999, Roithner et al. (withdrawn)

* cited by examiner

LIGHT EMITTER DEVICE

FIELD OF THE INVENTION

The present invention relates to a light emitting device, and in particular to a light emitting device formed on a Group IV-based semiconductor substrate.

BACKGROUND OF THE INVENTION

Recently, more and more researches are focus on forming a Group III-nitride based light emitting device (LED) structure on a Group IV-based semiconductor substrate. This is because the Group IV-based semiconductor substrate is much cheaper than that of the typical LED substrates, such as sapphire substrate or the silicon carbide (SiC) substrate. The LED structure formed on the Group IV-based semiconductor substrate is also much easier to be integrated on the integration circuits formed on the Group IV-based semiconductor substrate, or could be easily compatible with the fabrication process of the integration circuits on the Group IV-based semiconductor substrate. Nevertheless, the hetero-junction structure existing between the Group III-nitride based LED structure and the Group IV-based substrate usually brings some structural problems due to the mismatch of two different crystalline lattices and/or the difference of coefficient of thermal expansion (CTE) between these two materials in the hetero-junction structure. The mismatch of the hetero-junction structure always causes bad epitaxy quality of LED structure, which might greatly affect the optical property of the light emitting device.

There are many references relating to the fabrication of the Group III-nitride based LED structure on the Group IV-based substrate. C. A. Tran disclosed in Applied Physics Letters (1999) a method for growing an InGaN/GaN multiple quantum well (MQW) blue light emitting diodes (435 nm) on a silicon (111) substrate by the metalorganic vapor phase epitaxiy (MOVPE) process, where the LED is operable in 4 volts. However, the epitaxial film of such LED would be cracked due to the stress existing between the epitaxial film and the silicon substrate.

B. J. Zhang et al. also disclosed in Phys. Stat. Sol. (a) (2001) an InGaN multiple quantum well (MQW) light emitting diodes (LED) structure formed on a silicon (111) substrate. The MQW LED is fabricated by the steps of forming an n-type AlN/AlGaN (120/380 nm) buffer layer in the temperature of 1130° C. by the MOCVD, forming an n-type GaN layer of 0.2 µm, forming an $In_{0.13}Ga_{0.87}N$ quantum well of 3 nm, forming an $In_{0.01}Ga_{0.99}N$ barrier layer of 5 nm, forming a p-doped layer of $Al_{0.15}Ga_{0.85}N$ of 20 nm and forming a p-type GaN cover layer of 0.2 µm. Although the crack does not occur in the LED structure disclosed by B. J. Zhang et al., it is clear that the formation of the n-type AlN/AlGaN buffer layer in the temperature of 1130° C. could likely result in the formation of the AlSi alloy since the eutectic point thereof is about 577° C. Thus, the epitaxy quality of the LED structure could be affected by the formation of the AlSi alloy.

A. Dadgar et al. also disclosed in Phys. Stat. Sol. (a) (2001) a crack free InGaN/GaN LED structure on a silicon (111) substrate. Such LED structure is fabricated by the steps of forming a patterned silicon nitride on a silicon substrate by a sputtering process, and then forming a silicon-doped AlN layer, 15 pairs of AlGaN/GaN multiplayer structure, GaN:Si structure of 300 nm and three-layered InGaN/GaN quantum well on the pre-deposited aluminum layer. Although such LED structure is crack free, the formation of the patterned silicon nitride will occupy many areas of the silicon substrate, which results in the decrease of the effective area of the LED.

In addition, please refer to FIG. 1(A) and FIG. 1(B), which respective show a conventional nitride LED structure formed on a SiC/Si substrate and on a SOI (silicon on insulator) substrate according to the U.S. Pat. No. 5,786,606 by Johji Nishio et al. The conventional LED structure is mainly focused on forming a silicon layer on a Si or SiC substrate having thereon a silicon oxide ($SiO_2$) layer, and then forming the LED active layer on the silicon layer. After the formation of the LED active layer, the silicon oxide layer is removed by a wet etching process, so as to form the LED structure shown in the respective FIG. 1(A) and FIG. 1(B). Nevertheless, it is clear that the fabrication processes for the LED structures in the respective FIG. 1(A) and FIG. 1(B) are much complicated, time consuming and costly.

In order to overcome the above-mentioned issues, a novel light emitting device (LED) structure on a Group IV-based semiconductor substrate and the fabrication method therefore are provided. In such a light emitting device (LED) structure and the fabrication method, the epitaxy quality and the optical property of the LED structure on a Group IV-based semiconductor substrate will be greatly improved.

SUMMARY OF THE INVENTION

It is a first aspect of the present invention to provide a light emitting device (LED) structure formed on a Group IV-based semiconductor substrate. The LED structure includes a Group IV-based substrate, an AlN nucleation layer formed on the Group IV-based substrate, a GaN epitaxial layer formed on the AlN nucleation layer, a distributed Bragg reflector (DBR) multi-layer structure formed on the epitaxial layer, and an LED active layer formed on the DBR multi-layer structure.

Preferably, the LED structure further includes a GaN buffer layer formed between the LED active layer and the DBR multi-layer structure.

Preferably, the DBR multi-layer structure is made of a nitride including a Group III element.

Preferably, the GaN epitaxial layer is a patterned epitaxial layer.

Preferably, the DBR multi-layer structure is a patterned multi-layer structure.

Preferably, LED active layer further includes an n-type AlGaN layer, an n-type GaN layer formed on the n-type AlGaN layer, a multiple quantum wells (MQWs) active layer formed on the n-type GaN layer, a p-type AlGaN layer formed on the MQWs active layer, and a p-type GaN layer formed on the p-type AlGaN layer.

Preferably, the DBR multi-layer structure has a reflective surface having a tilt angle ranged from 5 to 75 degree with respect to a vertical line.

Preferably, the reflective surface has a tilt angle of 64 degree with respect to a vertical line.

It is a second aspect of the present invention to provide a light emitting device (LED) structure formed on a Group IV-based semiconductor substrate. The LED structure includes a substrate having a distributed Bragg reflector (DBR) multi-layer structure, a GaN buffer layer formed on the substrate, and an LED active layer formed on the GaN buffer layer.

Preferably, the substrate further includes a Group IV-based substrate, a nucleation layer formed on the Group IV-based substrate, an epitaxial layer formed on the nucleation layer, and a patterned distributed Bragg reflector (DBR) multi-layer structure formed on the epitaxial layer.

Preferably, the DBR multi-layer structure is made of a nitride including a Group III element.

Preferably, the nucleation layer is an AlN diffusion barrier layer.

Preferably, the epitaxial layer is a patterned GaN epitaxial layer.

Preferably, the LED active layer further includes an n-type AlGaN layer formed on the GaN buffer layer, an n-type GaN layer formed on the n-type AlGaN layer, a multiple quantum wells (MQWs) active layer formed on the n-type GaN layer, a p-type AlGaN layer formed on the MQWs active layer, and a p-type GaN layer formed on the p-type AlGaN layer;

Preferably, the DBR multi-layer structure has a reflective surface having a tilt angle ranged from 5 to 75 degree with respect to a vertical line.

Preferably, the reflective surface has a tilt angle of 64 degree with respect to a vertical line.

It is a third aspect of the present invention to provide a fabrication method for a light emitting device. The fabrication method includes the steps of providing a substrate having a distributed Bragg reflector (DBR) multi-layer structure, forming a GaN buffer layer on the substrate, and forming an LED active layer on the GaN buffer layer, wherein the GaN buffer layer is formed on the substrate by a lateral growth process.

Preferably, the step for providing the substrate having a DBR multi-layer structure further includes the step of providing a Group IV-based substrate, forming an AlN diffusion barrier layer on the Group IV-based substrate by a relatively low temperature growth process, forming a patterned GaN epitaxial layer on the AlN diffusion barrier layer, and forming a patterned DBR multi-layer structure formed on the patterned GaN epitaxial layer.

The above objects and advantages of the present invention will become more readily apparent to those ordinarily skilled in the art after reviewing the following detailed descriptions and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1A:
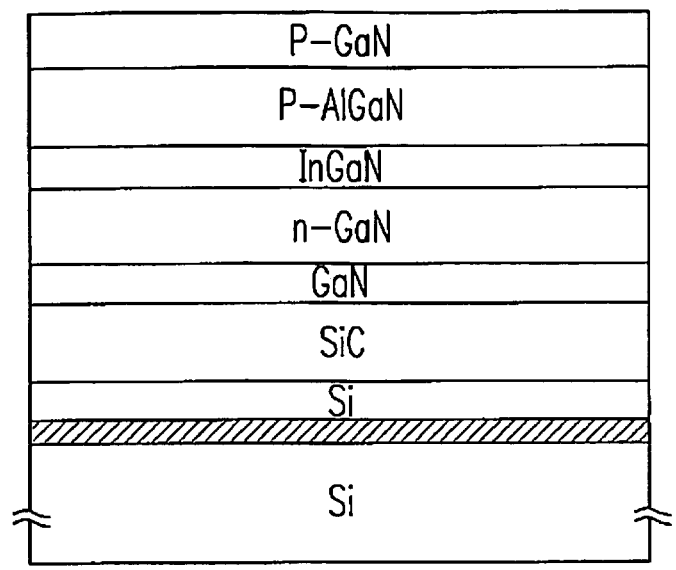
FIG. 1(A) and FIG. 1(B) are diagrams schematically illustrating the conventional nitride LED structure formed on a SiC/Si substrate and on a SOI substrate according to the prior arts.
Figure 1B:
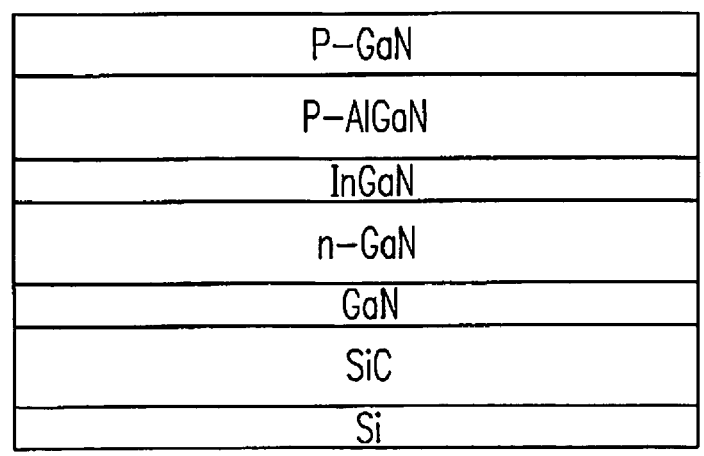
Figure 2:
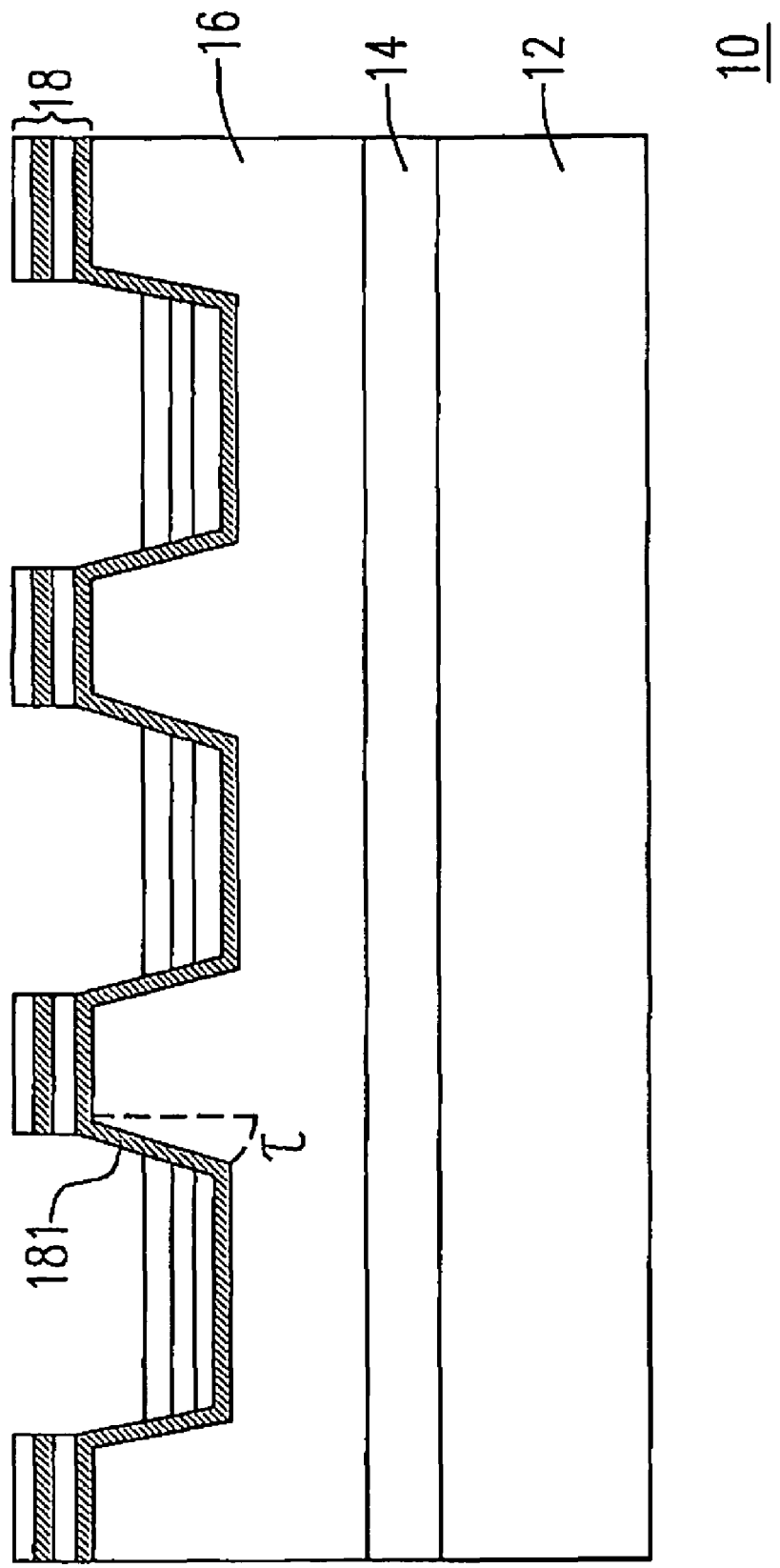
FIG. 2 is a diagram schematically illustrating a group IV-based substrate having a patterned Group III nitride distributed Bragg reflector (DBR) multi-layer structure according to the present invention.

Please refer to FIG. 2, which schematically shows a substrate structure having a patterned Group III nitride distributed Bragg reflector (DBR) multi-layer structure according to the present invention. As shown in FIG. 2, the substrate structure 10 including a group IV-based substrate 12, a nucleation layer 14, an epitaxial layer 16 and a patterned distributed Bragg reflector (DBR) multi-layer structure 18. Typically, the nucleation layer 14 is an AlN diffusion barrier layer formed on the group IV-based substrate 12 by a relatively low temperature growth process. Since the growth process is implemented in the relatively low temperature, the possible eutectic reaction between the Al element of the AlN diffusion barrier layer and the group IV element, such as silicon element, of the group IV-based substrate 12 could be avoidable. Further, the nucleation layer 14 could also be used as a diffusion barrier layer barrier layer for preventing the silicon of the group IV-based substrate 12 from further being diffused. After the formation of the AlN nucleation layer (or diffusion barrier layer) 14, a patterned GaN epitaxial layer 16 is formed on the nucleation layer 14, and then a distributed Bragg reflector (DBR) multi-layer structure 18, which is made of the Group III nitride and has a pattern corresponding to the patterned GaN epitaxial layer, is formed on the epitaxial layer 16.

Figure 3:
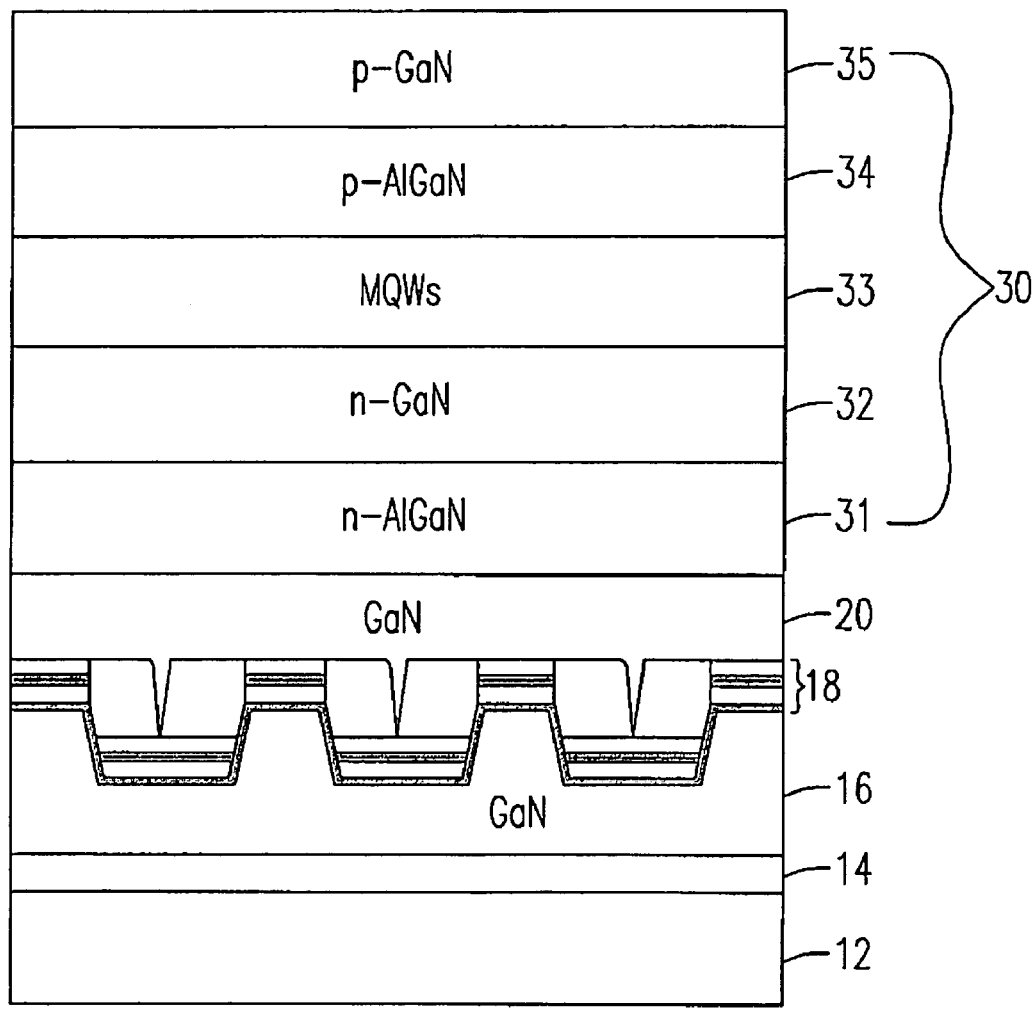
FIG. 3 is a diagram schematically illustrating a Group III nitride LED structure formed on a group IV-based substrate according to an preferred embodiment of the present invention.

Please further refer to FIG. 3, after the formation of the substrate structure 10 having a patterned Group III nitride DBR multi-layer structure, as shown in FIG. 2, an GaN buffer layer 20 is formed on the substrate structure 10 through a lateral growth process. Then, an LED active layer 30 is formed on the GaN buffer layer 20, so that a light emitting device (LED) structure 100 formed on the Group IV-based substrate structure 10 having a distributed Bragg reflector (DBR) multi-layer structure is provided.

As mentioned above, the distributed Bragg reflector (DBR) multi-layer structure 18 of the present invention is preferably made of a material including a nitride of Group III material. The DBR multi-layer structure 18 is not only used for reflecting the light emitting from the LED active layer 30, but also used as a barrier layer preventing the defect of epitaxial layer 16 from being diffused upwardly. Accordingly, the DBR multi-layer structure 18 could not only improve the optical property of the LED structure but also increase the light extraction efficiency of the LED structure. In a preferred embodiment of the present invention, the DBR multi-layer structure 18 further has a reflective surface 181 (as shown in FIG. 2) having a tilt angle $\tau$ with respect to a vertical. Typically, the light extraction efficiency of the LED structure could be affected by the tilt angle $\tau$. Preferably, the tilt angle $\tau$ of the reflective surface 181 is ranged from 5 to 75 degree. In a preferred embodiment of the present invention, the light extraction efficiency of the LED structure 100 is optimal in a tilt angle $\tau$ of 64 degree with respect to a vertical line.

On the other hand, in a preferred embodiment of the present invention, the LED active layer 30 of the LED structure 100 according to the present invention could include an n-type AlGaN layer 31 formed on the GaN buffer layer 20, an n-type GaN layer 32 formed on the n-type AlGaN layer 31, a multiple quantum wells (MQWs) active layer 33 formed on the n-type GaN layer 32, a p-type AlGaN layer 34 formed on the MQWs active layer 33, and a p-type GaN layer 35 formed on the p-type AlGaN layer 34.

On the other hand, since the GaN buffer layer 20 disposed between the LED active layer 30 and the Group IV-based substrate structure 10 having a distributed Bragg reflector (DBR) multi-layer structure 18 is formed by a lateral growth process, there could be few stress accumulated within the GaN buffer layer 20. Accordingly, a better epitaxiy quality for the LED structure 100 could be obtained. Please refer to FIG.

Figure 4:
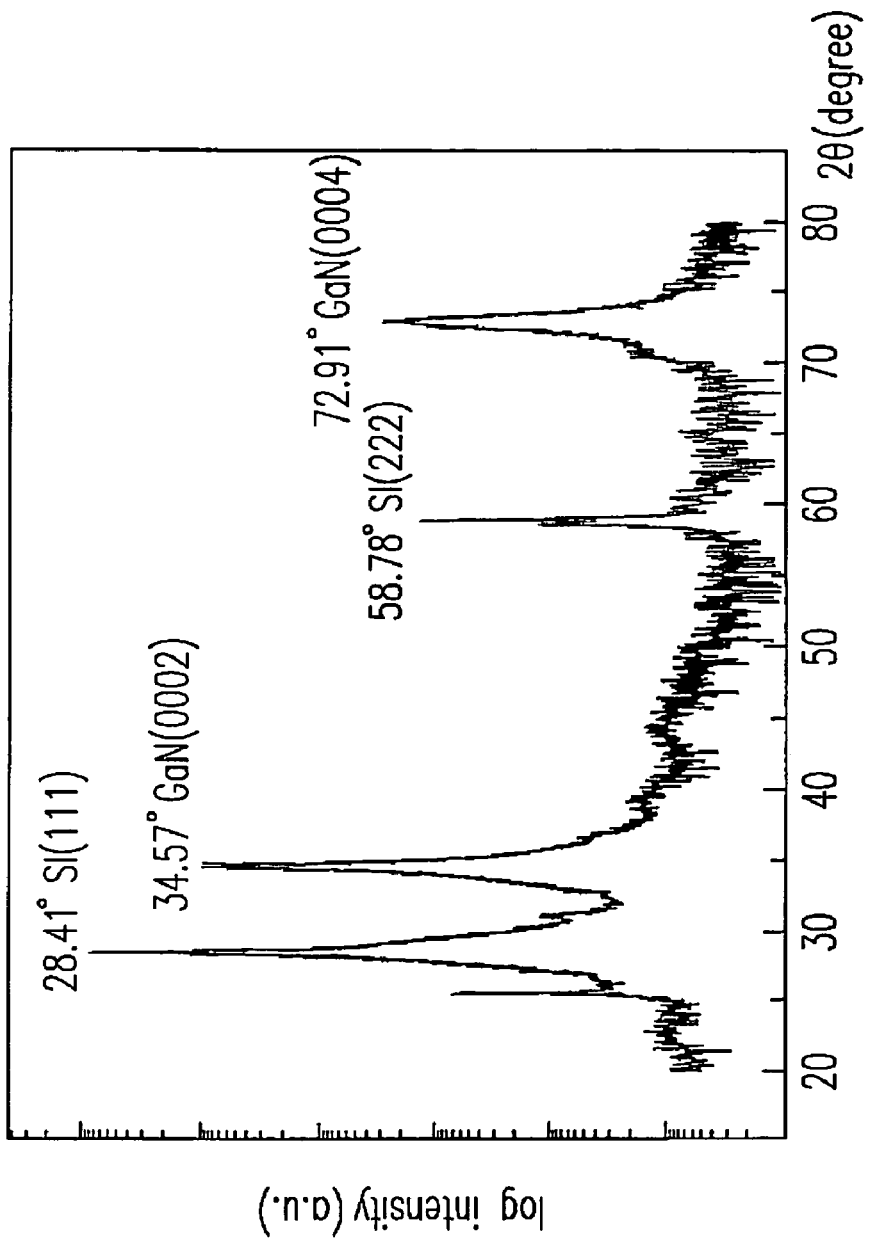
FIG. 4 is an XRD diffraction diagram of the LED structure according to FIG. 3.

4, which shows an XRD diffraction diagram of the LED structure according to FIG. 3. As shown in FIG. 4, the peak value of the GaN buffer layer 20 occur at 34.57°, which means the stress within the GaN buffer layer 20 is released.

Figure 5:
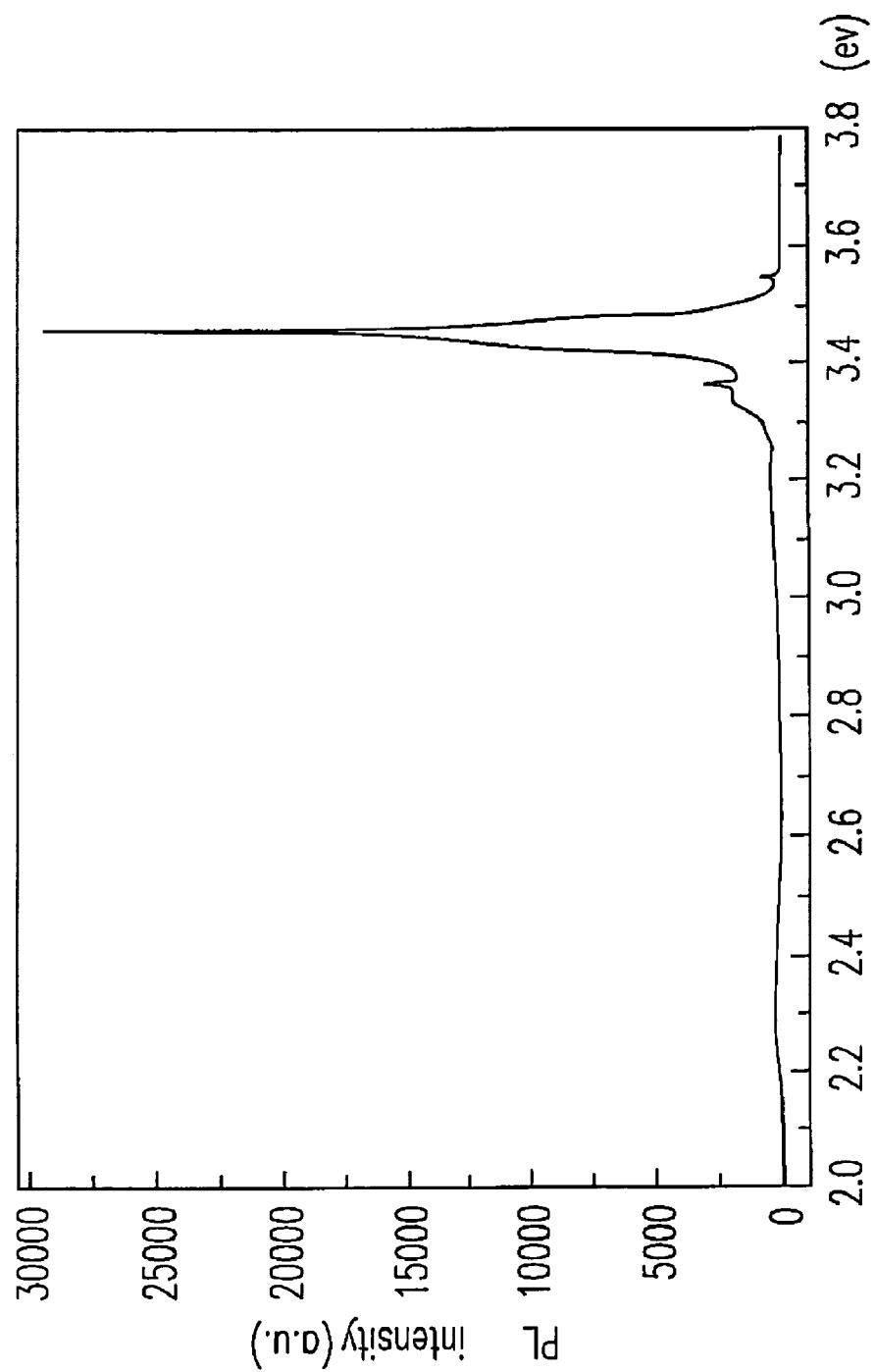
FIG. 5 is a Photoluminescence (PL) intensity diagram of the LED structure according to FIG. 3 at the temperature of 13 K.

Further, please refer to FIG. 5, which further shows a Photoluminescence (PL) intensity diagram of the LED structure according to FIG. 3 at the temperature of 13 K. As shown in FIG. 5, both the high peak value of the PL intensity and the smaller width of the full-width-half-maximum (FWHM) of the PL spectrum imply that a better epitaxy quality of the LED structure 100 is obtained.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A light emitting device (LED), comprising:
   a Group IV-based substrate;
   an AlN nucleation layer formed on the Group IV-based substrate;
   a GaN epitaxial layer formed on the AlN nucleation layer;
   a distributed Bragg reflector (DBR) multi-layer structure formed on the epitaxial layer, wherein the DBR multi-layer structure has a reflective surface having a tilt angle ranged from 5 to 75 degree with respect to a vertical line; and
   an LED active layer formed on the DBR multi-layer structure.

2. A light emitting device according to claim 1, further comprising a GaN buffer layer formed between the LED active layer and the DBR multi-layer structure.

3. A light emitting device according to claim 1, wherein the DBR multi-layer structure is made of a nitride comprising a Group III element.

4. A light emitting device according to claim 1, wherein the GaN epitaxial layer is a patterned epitaxial layer.

5. A light emitting device according to claim 1, wherein the DBR multi-layer structure is a patterned multi-layer structure.

6. A light emitting device according to claim 1, wherein the LED active layer further comprises:
   an n-type AlGaN layer;
   an n-type GaN layer formed on the n-type AlGaN layer;
   a multiple quantum wells (MQWs) active layer formed on the n-type GaN layer;
   a p-type AlGaN layer formed on the MQWs active layer; and
   a p-type GaN layer formed on the p-type AlGaN layer.

7. A light emitting device according to claim 1, wherein the reflective surface has a tilt angle of 64 degree with respect to a vertical line.

8. A light emitting device (LED), comprising:
   a substrate having a distributed Bragg reflector (DBR) multi-layer structure, wherein the DBR multi-layer structure has a reflective surface having a tilt angle ranged from 5 to 75 degree with respect to a vertical line;
   a GaN buffer layer formed on the substrate; and
   an LED active layer formed on the GaN buffer layer.

9. A light emitting device according to claim 8, wherein the substrate further comprises:
   a Group IV-based substrate;
   a nucleation layer formed on the Group IV-based substrate;
   an epitaxial layer formed on the nucleation layer; and
   a patterned distributed Bragg reflector (DBR) multi-layer structure formed on the epitaxial layer.

10. A light emitting device according to claim 9, wherein the DBR multi-layer structure is made of a nitride comprising a Group III element.

11. A light emitting device according to claim 9, wherein the nucleation layer is an AlN diffusion barrier layer.

12. A light emitting device according to claim 9, wherein the epitaxial layer is a patterned GaN epitaxial layer.

13. A light emitting device according to claim 8, wherein the LED active layer further comprises:
   an n-type AlGaN layer formed on the GaN buffer layer;
   an n-type GaN layer formed on the n-type AlGaN layer;
   a multiple quantum wells (MQWs) active layer formed on the n-type GaN layer;
   a p-type AlGaN layer formed on the MQWs active layer; and
   a p-type GaN layer formed on the p-type AlGaN layer.

14. A light emitting device (LED), comprising:
   a substrate having a distributed Bragg reflector (DBR) multi-layer structure, and the substrate further comprising:
      a Group IV-based substrate;
      a nucleation layer formed on the Group IV-based substrate;
      an epitaxial layer formed on the nucleation layer; and
      a patterned distributed Bragg reflector (DBR) multi-layer structure formed on the epitaxial layer, wherein the DBR multi-layer structure has a reflective surface having a tilt angle ranged from 5 to 75 degree with respect to a vertical line;
   a GaN buffer layer formed on the substrate; and
   an LED active layer formed on the GaN buffer layer.

15. A light emitting device according to claim 14, wherein the reflective surface has a tilt angle of 64 degree with respect to a vertical line.

16. A light emitting device according to claim 8, wherein the reflective surface has a tilt angle of 64 degree with respect to a vertical line.

* * * * *